(12) United States Patent
Kanakasabapathy et al.

(10) Patent No.: US 10,121,785 B2
(45) Date of Patent: Nov. 6, 2018

(54) PITCH SCALABLE ACTIVE AREA PATTERNING STRUCTURE AND PROCESS FOR MULTI-CHANNEL FIN FET TECHNOLOGIES

(71) Applicant: INTERNATIONAL BUSINESS MACHINES CORPORATION, Armonk, NY (US)

(72) Inventors: Sivananda K. Kanakasabapathy, Niskayuna, NY (US); Fee Li Lie, Albany, NY (US); Eric Miller, Schenectady, NY (US); Stuart A. Sieg, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 35 days.

(21) Appl. No.: 15/397,123

(22) Filed: Jan. 3, 2017

(65) Prior Publication Data
US 2017/0213825 A1     Jul. 27, 2017

Related U.S. Application Data

(62) Division of application No. 15/004,063, filed on Jan. 22, 2016, now Pat. No. 9,589,958.

(51) Int. Cl.
*H01L 21/00* (2006.01)
*H01L 27/088* (2006.01)
(Continued)

(52) U.S. Cl.
CPC ...... *H01L 27/0886* (2013.01); *H01L 21/3081* (2013.01); *H01L 21/31144* (2013.01); *H01L 21/823431* (2013.01); *H01L 27/0924* (2013.01); *H01L 29/161* (2013.01); *H01L 29/1608* (2013.01); *H01L 29/201* (2013.01); *H01L 29/6653* (2013.01); *H01L 29/66545* (2013.01)

(58) Field of Classification Search
CPC .................................................. H01L 27/0886
USPC .......................................................... 438/105
See application file for complete search history.

(56) References Cited

U.S. PATENT DOCUMENTS

2015/0255299 A1* 9/2015 Cantone ............. H01L 21/3086
                                                        438/702

OTHER PUBLICATIONS

List of IBM Patents or Patent Applications Treated as Related; (Appendix P), Filed Jan. 3, 2017; 2 pages.
(Continued)

*Primary Examiner* — Ajay K Arora
(74) *Attorney, Agent, or Firm* — Cantor Colburn LLP; Jennifer Anda

(57) ABSTRACT

Provided herein is a multi-channel finFET having a plurality of fins prepared by a process. The process includes forming a series of mandrels on hard mask layer which overlays a semiconductor layer. The semiconductor layer has areas of a first semiconductor material and a second semiconductor material in contact with the hard mask layer. The process includes applying a first conformal coating on the hard mask layer and the series of mandrels, to form spacer layer sacrificial fins. The process includes removing the first conformal coating from horizontal surfaces while retaining the first conformal coating on sidewalls of the series of mandrels. The process includes removing the series of mandrels and etching into a material of the hard mask layer using the spacer layer sacrificial fins as a mask.

1 Claim, 10 Drawing Sheets

(51) Int. Cl.
    *H01L 21/8234*     (2006.01)
    *H01L 21/308*     (2006.01)
    *H01L 29/66*     (2006.01)
    *H01L 21/311*     (2006.01)
    *H01L 29/16*     (2006.01)
    *H01L 29/161*     (2006.01)
    *H01L 29/201*     (2006.01)
    *H01L 27/092*     (2006.01)

(56) References Cited

OTHER PUBLICATIONS

Sivananda K. Kanakasabapathy et al., U.S. Appl. No. 15/004,063, entitled "Pitch Scalable Active Area Patterning Structure & Process for Multi-Channel Fin FET Technologies," filed Jan. 22, 2016.

\* cited by examiner

PITCH SCALABLE ACTIVE AREA PATTERNING STRUCTURE AND PROCESS FOR MULTI-CHANNEL FIN FET TECHNOLOGIES

DOMESTIC PRIORITY

This application is a divisional of U.S. application Ser. No. 15/004,063, filed on Jan. 22, 2016, the disclosure of which is incorporated by reference herein in their entirety.

BACKGROUND

The present invention relates generally to field effect transistor (FET) devices, and more specifically, to FinFET devices.

Field effect transistors (FETs) are widely used in the electronics industry for switching, amplification, filtering, and other tasks related to both analog and digital electrical signals. Most common among these are metal-oxide-semiconductor field-effect transistors (MOSFET), in which a gate structure is energized to create an electric field in an underlying channel region of a semiconductor body, by which electrons are allowed to travel through the channel between a source region and a drain region of the semiconductor body.

Complementary metal-oxide-semiconductor field-effect transistors, which are typically referred to as CMOS devices, have become widely used in the semiconductor industry. These CMOS devices include both n-type and p-type (NMOS and PMOS) transistors, and therefore promote the fabrication of logic and various other integrated circuitry.

The escalating demands for high density and performance associated with ultra large scale integrated (ULSI) circuit devices have required certain design features, such as shrinking gate lengths, high reliability and increased manufacturing throughput. The continued reduction of design features has challenged the limitations of conventional fabrication techniques. Three-dimensional semiconductor devices, such as fin-type semiconductor devices (referred to as finFETs), typically include dielectric gate spacers formed on sidewalls of the gate stack to isolate the gate stack from the adjacent source/drain (S/D) regions.

FinFET devices include an arrangement of fins disposed on a substrate. The fins are formed from a semiconductor material. A gate stack is arranged over the fins and defines a channel region of the fins, while regions of the fins extending outwardly from the channel region define active source and drain regions of the device.

Previous methods for patterning the fins included depositing or thermally growing a hardmask layer of an oxide material over a layer of semiconductor material and depositing a lithographic mask over the hardmask layer. The fins are formed by removing exposed portions of the hardmask layer and the semiconductor material resulting in an arrangement of fins having a hardmask layer arranged on the semiconductor material that is disposed on an insulator layer of the substrate.

As the scale of features in finFET devices continues to scale down through successive technology development nodes, challenges emerge for the design of processes to achieve the desired critical dimensions of required features in the finished finFET device.

SUMMARY

According to an embodiment of the present invention, a method is provided for forming a series of mandrels on a hard mask layer, which overlays a semiconductor layer in contact with the hardmask layer; applying a conformal coating to form a spacer layer to produce sacrificial fins on the hard mask layer and the mandrels; removing the conformal coating from the top and between the mandrels; removing the mandrels; cutting the spacer layer sacrificial fins into the hardmask; removing the remaining spacer layer; covering desired hardmask sacrificial fins with a mask; removing an undesired sacrificial fin; removing the remaining mask; applying a conformal coating to build a total thickness of the sacrificial fin and conformal coating equal to critical dimension and etchback allowance; etching the conformal coatings from horizontal surfaces while retaining them on the sidewall to leave the hard mask sacrificial fins and conformal side coating spacers; and etching semiconductor substrate to form fins of a desired dimension.

According to another embodiment a method is provided for forming a multi-channel finFET having a plurality of fins having a critical dimension by: forming a series of mandrels on hard mask layer which overlays a semiconductor layer, the semiconductor layer having areas of a first semiconductor material and a second semiconductor material in contact with the hardmask layer; applying a conformal coating to form a spacer layer to produce sacrificial fins on the hard mask layer and the mandrels; removing the conformal coating from top and between the mandrels; removing the mandrels; cutting the spacer layer sacrificial fins into the hardmask; removing the remaining spacer layer; covering desired hard mask sacrificial fins with a mask; removing undesired sacrificial fins; removing the remaining mask; applying a conformal coating to build a total thickness of the sacrificial fin and the conformal coating equal to a critical dimension plus an etchback allowance; applying a second conformal coating layer to build a final thickness of the sacrificial fin and the coatings substantially equal to an additional etchback allowance of the semiconductor material; applying a blocking resist to the second semiconductor material; etching the second conformal coating to leave hard mask and first conformal coating in unmasked areas; removing the blocking resist; etching the conformal coatings from horizontal surfaces while retaining them on the sidewall to leave the hard mask sacrificial fins and conformal side coating spacers; and etching the semiconductor substrate to form fins of desired dimension in the first semiconductor material and the second semiconductor material.

According to another embodiment, a multi-channel finFET is provided having a plurality of fins prepared by a process comprising: forming a series of mandrels on a hard mask layer which overlays a semiconductor layer, the semiconductor layer having areas of a first semiconductor material and a second semiconductor material in contact with the hardmask layer; applying a conformal coating to form a spacer layer thinner than necessary to produce sacrificial fins of critical dimension, on hard mask layer and mandrels; removing conformal coating from top and between the mandrels; removing the mandrels; cutting the spacer layer sacrificial fins in hard mask material; covering desired hard mask sacrificial fins with a mask; removing undesired sacrificial fins; removing the remaining mask; applying a conformal coating to build a total thickness of sacrificial fin and coating equal to critical dimension and etchback allowance; etching the conformal coating from the top and between the hardmask sacrificial fins to leave the hardmask sacrificial fins and conformal side coating spacers; and etching the substrate to form fins of desired dimension in the first semiconductor and the second semiconductor.

According to another embodiment, a multi-channel fin-FET having a plurality of fins prepared by a process is provided. The process includes forming a series of mandrels on hard mask layer which overlays a semiconductor layer. The semiconductor layer has areas of a first semiconductor material and a second semiconductor material in contact with the hard mask layer. The process includes applying a first conformal coating on the hard mask layer and the series of mandrels, to form spacer layer sacrificial fins. The process includes removing the first conformal coating from horizontal surfaces while retaining the first conformal coating on sidewalls of the series of mandrels. The process includes removing the series of mandrels and etching into a material of the hard mask layer using the spacer layer sacrificial fins as a mask. The process includes removing undesired fins of the spacer layer sacrificial fins to leave desired fins and applying a second conformal coating to build a total thickness of the desired fins and the second conformal coating being equal to a critical dimension plus an etchback allowance. The process includes applying a third conformal coating layer to build a final thickness of the desired fins and the second and third conformal coatings being substantially equal to an additional etchback allowance of the first and second semiconductor materials. The process includes applying a blocking resist to the second semiconductor material. The process includes etching the third conformal coating to leave a hard mask and first conformal side coating spacers in unmasked areas. The process includes removing the blocking resist and etching the second and third conformal coatings from horizontal surfaces while retaining the second and third conformal coatings on sidewalls to leave hard mask sacrificial fins and second conformal side coating spacers. The process includes etching a semiconductor substrate to form fins of desired dimension in the first semiconductor material and the second semiconductor material Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
FIG. 1 illustrates a side view of an exemplary embodiment of a semiconductor-on-insulator (SOI) substrate with a hardmask layer.

As the scale of features in finFET devices continues to scale down through successive technology development nodes, challenges emerge for the design of processes to achieve the desired critical dimensions of required features in the finished finFET device. The scaling down of fin pitch allows less room for adding width to the spacers which are used to set sacrificial fin width in an effort to allow for dimensional erosion, also known an etchback allowance, during reactive ion etching (RIE).

In addition, once the sacrificial fins are cut beneath the spacers, the narrow gaps between the fins makes the application of fin cut masks problematic, in that there is scant room to land the edge of the fin cut mask reliably in the position required to remove unwanted fins while retaining desired fins. This mismatch between the achievable degree of precision in fin cut mask application and the size of the gaps between fins presents challenges for the design of reproducible manufacturing processes, which must meet statistical quality measures in order to qualify for adoption.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

A method is provided which cuts hard mask fins thinner than the target fin critical dimension and then enlarges the dimension of the hard mask fin critical dimension to meet the target fin critical dimension. By forming mandrel spacers thinner than would be expected using prior techniques, the method allows more space between the sacrificial fins which are formed beneath the spacers, thereby eliminating the difficulty in reproducibly forming the fin cut mask in the desired place between desired and undesired fins.

The hard mask sacrificial fins thus obtained are thinner than required in order to generate the semiconductor fins of desired critical dimension. This required additional thickness is added to the hard mask fins by applying a conformal coating. In alternate embodiments differing semiconductor materials are used in PFET and NFET areas. Due to the different etching rates experienced by different semiconductor materials protective coatings may be applied to the hard mask fins. Blocking resist may be applied to maintain the protective coating in areas containing the semiconductor material that is more readily etched while the protective coating is removed from areas containing the other semiconductor material.

A spacer is a film layer formed on the sidewall of a pre-patterned feature. A spacer is formed by deposition or reaction of the film on the previous pattern, followed by etching to remove all the film material on the horizontal surfaces, leaving only the material on the sidewalls. By removing the original patterned feature, only the spacer is left. However, since there are two spacers for every line, the line density has now doubled. This is commonly referred to as Self-Aligned Doubled Patterning (SADP). The spacer technique is applicable for defining narrow gates at half the original lithographic pitch, for example.

The spacer approach is unique in that with one lithographic exposure, the pitch can be halved indefinitely with a succession of spacer formation and pattern transfer processes. For example, two iterations of SADP leads to quartering of the pitch or quadrupling of features within the original pitch. Hence, this is often referred to as Self-Aligned Quadruple Patterning (SAQP). This conveniently avoids the serious issue of overlay between successive exposures.

With reference now to FIG. 1, which illustrates a side view of an exemplary embodiment of a semiconductor-on-insulator (SOI) substrate that includes an insulator layer 102 and a semiconductor layer 104 arranged thereon. The insulator layer 102 may include, for example a buried oxide (BOX) material.

Alternate embodiments may include, an arrangement of the semiconductor devices described herein on a bulk substrate The semiconducting material can include, but is not limited to, Si (silicon), strained Si, SiC (silicon carbide), Ge (germanium), SiGe (silicon germanium), SiGeC (silicon-germanium-carbon), Si alloys, Ge alloys, GaAs (gallium arsenide), InAs (indium arsenide), InP (indium phosphide), or any combination thereof. A hardmask layer 106 is disposed on the semiconductor layer 104. The hardmask layer 106 may include, for example, a nitride material.

Figure 2:
FIG. 2 illustrates a side view of the formation of a mandrel layer that is disposed on the semiconductor layer.

FIG. 2 illustrates the formation of a mandrel layer 210 that is disposed on the hardmask layer 106. The mandrel material layer 210 may include, for example, amorphous silicon material or amorphous carbon material.

Figure 3:
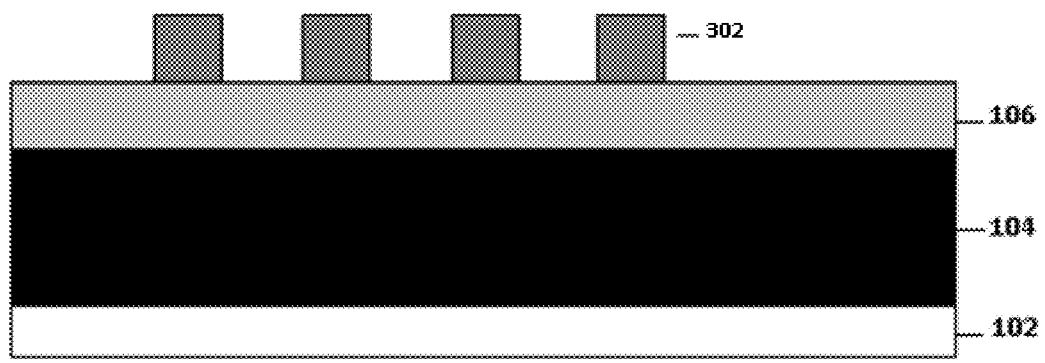
FIG. 3 illustrates a side view of resultant mandrels formed on the semiconductor layer.

FIG. 3 illustrates the resultant structure following a patterning and etching process that removes portions of the mandrel layer 210 using, for example, a lithographic patterning and anisotropic etching process such as reactive ion etching (RIE) to form mandrels 302 that are arranged on the hardmask layer 106.

Lithography can include forming a photoresist (not shown) on the sacrificial layer 108, exposing the photoresist to a desired pattern of radiation, and then developing the exposed photoresist with a resist developer to provide a patterned photoresist on top of the sacrificial mandrel layer 210. At least one etch is employed to transfer the pattern from the patterned photoresist into the sacrificial layer 210. The etching process may include a dry etch (e.g., reactive ion etching, plasma etching, ion beam etching, or laser ablation).

The etching process may alternatively include a wet chemical etch (e.g., with potassium hydroxide, or sulfuric acid and hydrogen peroxide). In some exemplary embodiments, both dry etching and wet chemical etching processes may be used. After transferring the pattern, the patterned photoresist is removed utilizing resist stripping processes, for example, ashing. Ashing may be used to remove a photoresist material, amorphous carbon, or organic planarization (OPL) layer. Ashing is performed using a suitable reaction gas, for example, $O_2$, $N_2$, H2/N2, $O_3$, $CF_4$, or any combination thereof.

Figure 4:
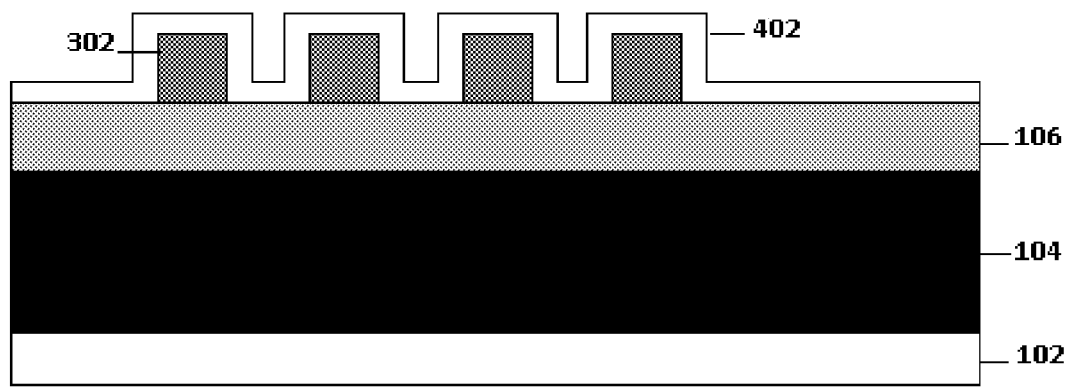
FIG. 4 illustrates a side view of the resultant structure following the deposition of a conformal layer of spacer material.

FIG. 4 illustrates a side view of the resultant structure following the deposition of a conformal layer of spacer material 402 over the mandrels 302 and exposed portions of the hardmask layer 106. The spacer material 402 may include, for example, a conformal oxide or nitride material.

Figure 5:
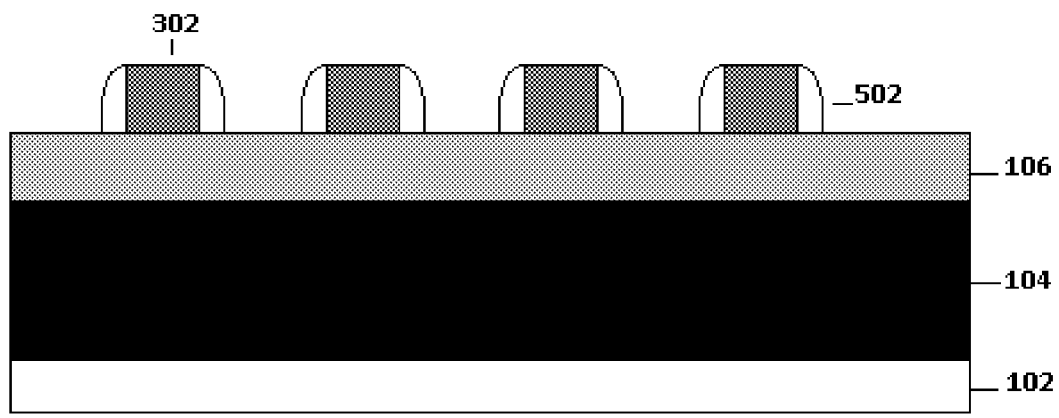
FIG. 5 illustrates a side view of the resultant structure following the removal of portions of the spacer material.

FIG. 5 illustrates the resultant structure following the removal of portions of the spacer material 402 that results in mandrel spacers 502. The mandrel spacers 502 may be formed by, for example, performing an anisotropic etching process that removes portions of the spacer material 402, but does not appreciably remove exposed portions of the mandrels 302.

Figure 6:
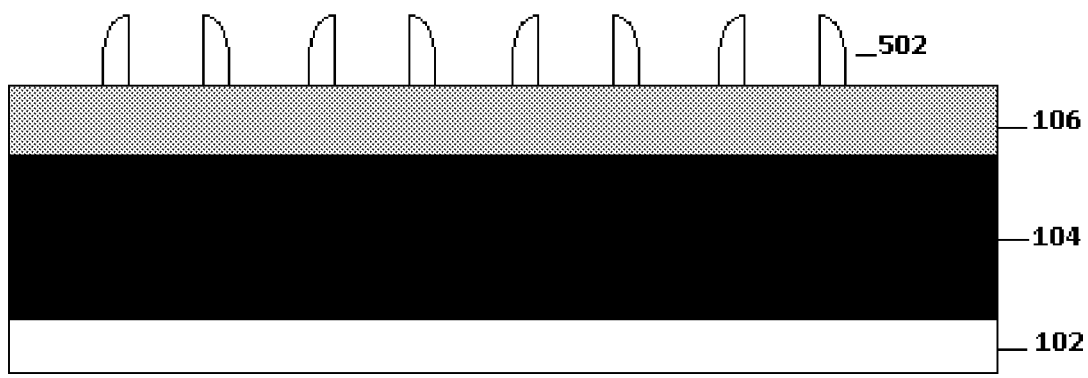
FIG. 6 illustrates a side view of the resultant structure following the removal of the mandrels.

FIG. 6 illustrates the resultant structure following the removal of the mandrels 302. The mandrels 302 may be removed by a suitable etching process that removes the mandrels 302, but does not appreciably remove the mandrel spacers 502 or the exposed portions of the hardmask layer 106.

Figure 7:
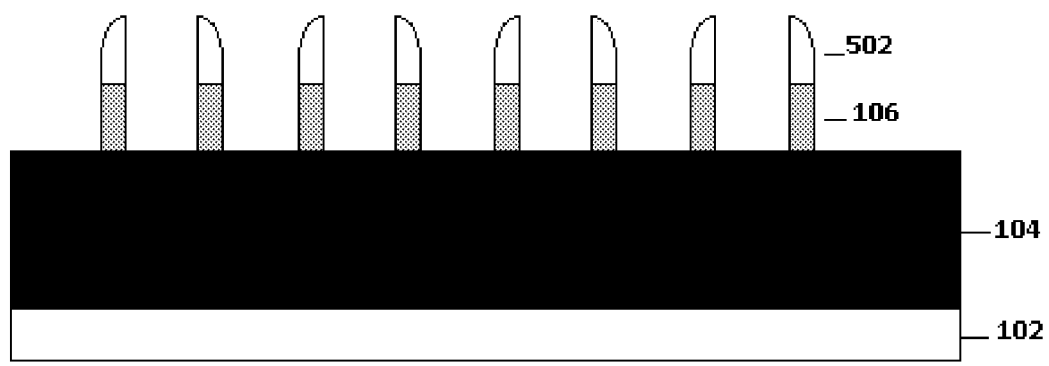
FIG. 7 illustrates a side view of the resultant structure following anisotropic etching process.

FIG. 7 illustrates the resultant structure following an isotropic etching process, such as for example RIE, to transfer the mandrel pattern into the hardmask layer 106. The etching process is selective such that it removes exposed portions of the hardmask layer 106, and does not appreciably remove the mandrel spacers 502 and the semiconductor material layer 104. Sacrificial fins of hard mask layer 106 stand on the semiconductor material layer 104 and carry mandrel spacers 502 on their upper surface.

Figure 8:
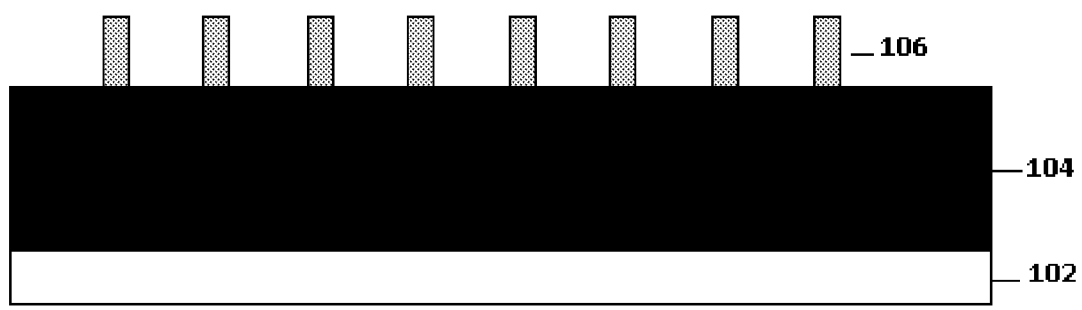
FIG. 8 illustrates a side view of the removal of the mandrel spacers.

FIG. 8 illustrates the removal of the mandrel spacers 502 (of FIG. 7), which exposes the patterned sacrificial fins of hard mask layer 106.

Figure 9:
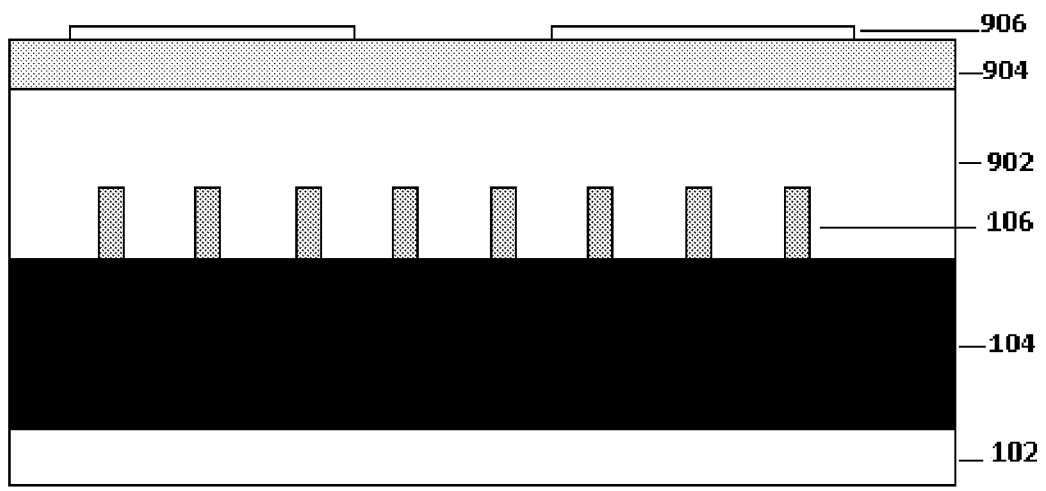
FIG. 9 is a side view of the resulting structure with the desired fins protected by an organic planarization layer and a silicon-containing antireflective coating (SiARC).

FIG. 9 illustrates an organic planarization layer 902, applied on top of the substrate and fin structures shown in FIG. 8, with a silicon-containing antireflective coating (SiARC) material 904 coated thereon, to provide etch resistance and reflectivity control, RX lithographic coating 906 applied and exposed in a pattern to protect the area containing desired fins of hard mask layer 106 and to expose the area containing undesired fins of hard mask layer 106.

Figure 10:
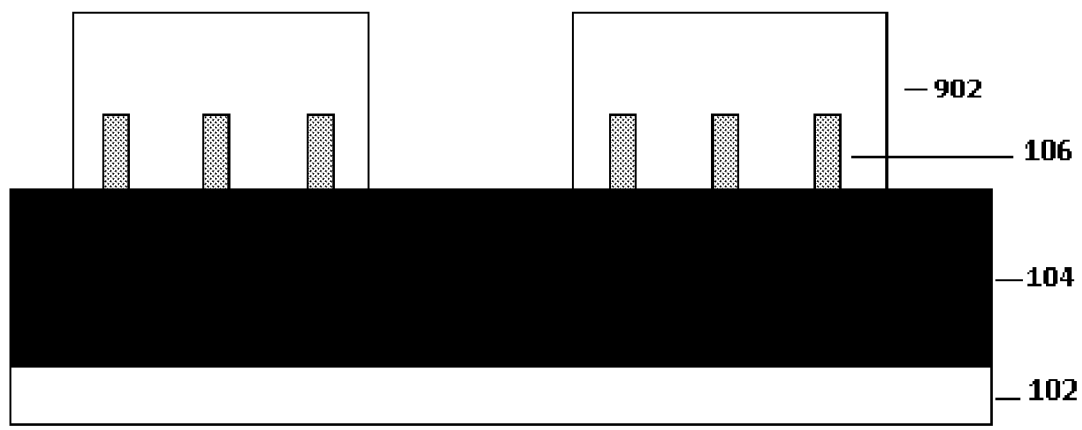
FIG. 10 is a side view of the removal of undesired sacrificial fins.

FIG. 10 illustrates the structure after removal of undesired fins of hard mask layer 106, to leave the desired fins of hard mask layer 106 protected by the organic planarizing layer 902.

Figure 11:
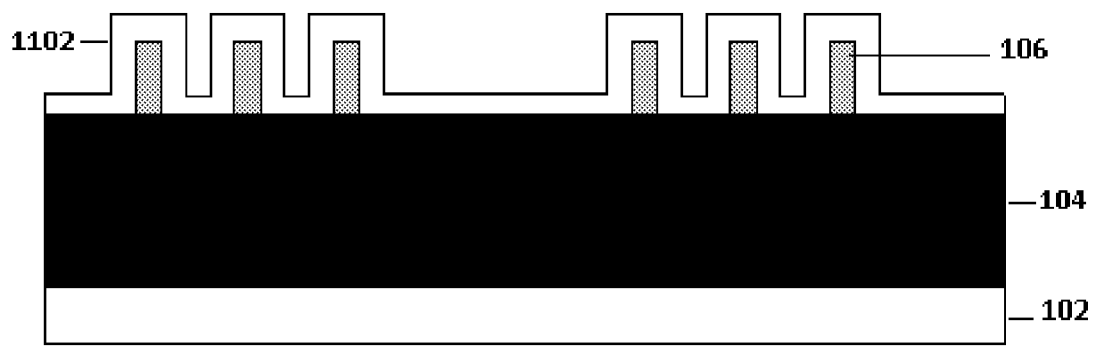
FIG. 11 is a side view of the desired fins and semiconductor layer coated with a self-aligned conformal spacer layer.

FIG. 11 illustrates the desired fins of hard mask layer 106 coated with a self-aligned conformal spacer layer 1102. The self-aligned conformal spacer layer 1102 is applied to provide a total width of desired fin of hard mask layer 106 and self-aligned conformal spacer layer 1102 to protect the semiconductor layer 104 over the critical dimension of the target fin in the semiconductor layer 104.

Figure 12:
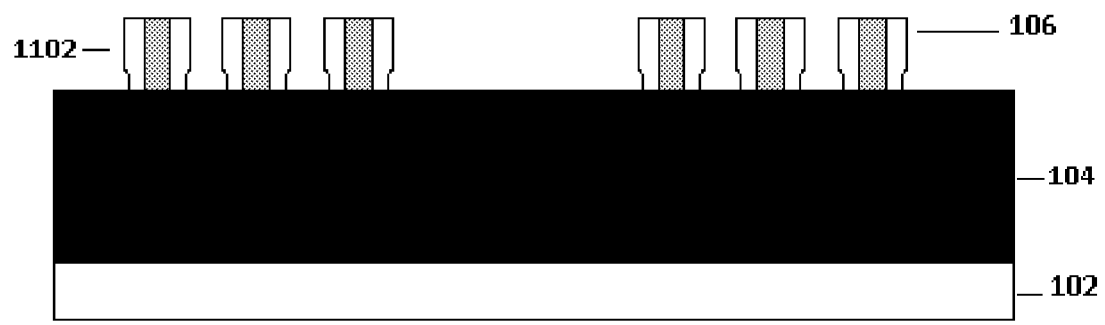
FIG. 12 is a side view of the structure after being etched back to expose the surface of the semiconductor layer.

FIG. 12 illustrates the desired fin of hard mask layer 106 and self-aligned conformal spacer layer 1102 after being etched back to expose the surface of the semiconductor layer 104.

Figure 13:
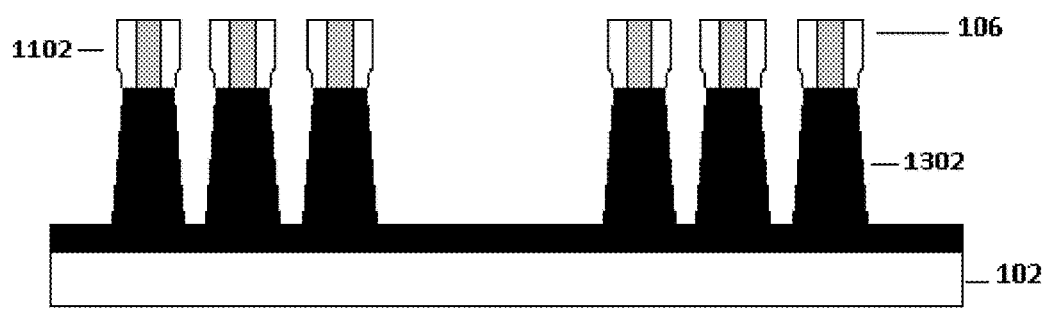
FIG. 13 is a side view of semiconductor fins carrying hard mask layer and self-aligned conformal spacer layer on the top thereof.

FIG. 13 illustrates semiconductor fins 1302, with hard mask layer 106 and self-aligned conformal spacer layer 1102 on the top layer thereof.

Figure 14:
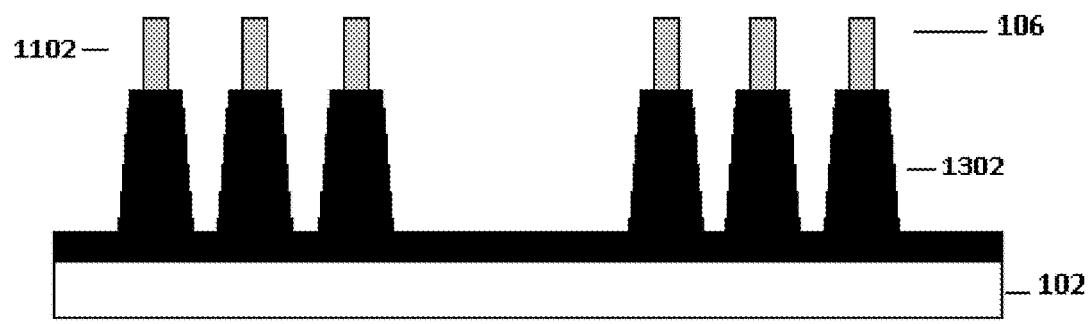
FIG. 14 is a side view of semiconductor fins after removal of self-aligned conformal spacer layer.

FIG. 14 illustrates semiconductor fins 1302, with hard mask layer 106 on the top layer thereof after removal of self-aligned conformal spacer layer 1102. Removal of the spacer layer 1102 widens the mouth of the gap between semiconductor fins 1302 to facilitate further processing steps, such as filling the gap with shallow trench isolation material.

Figure 15:
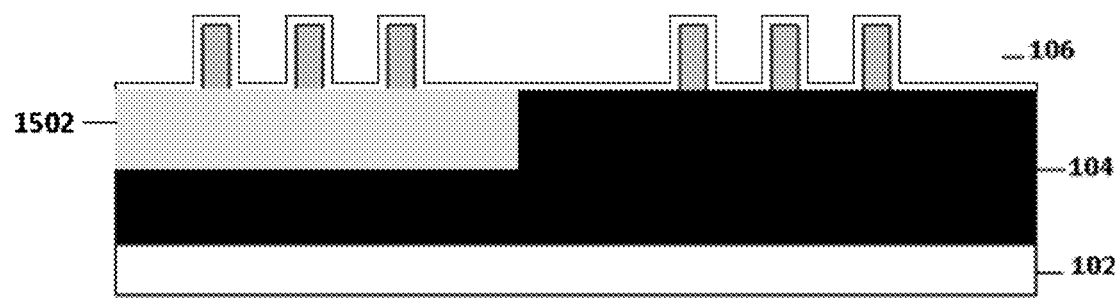
FIG. 15 is a side view of a semiconductor layer having PFET areas and NFET areas.

FIG. 15 to FIG. 19 illustrate alternate embodiments. FIG. 15 illustrates a semiconductor layer 104 that includes areas of a second semiconductor 1502, for example, as a step in producing a complimentary metal oxide semiconductor (CMOS) having PFET areas 1502, for example of Silicon Germanium, and NFET areas 1504, for example of Silicon, within the semiconductor layer 104.

Figure 16:
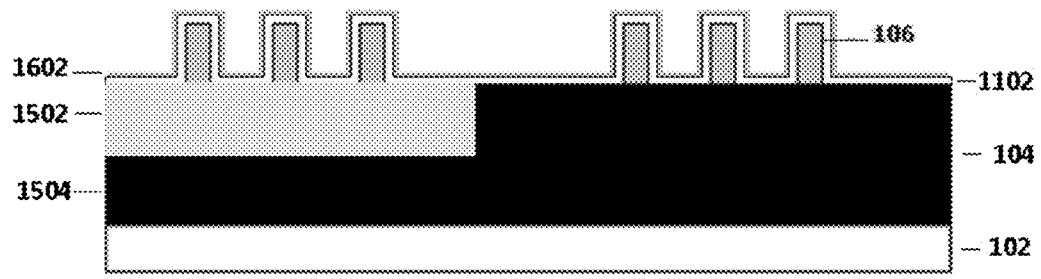
FIG. 16 is a side view of a semiconductor layer having PFET areas and NFET areas after applying a self-aligned conformal spacer layer and a thin self-aligned oxide spacer.

FIG. 16 illustrates an alternate embodiment in which after applying a first layer, 1102 for example a self-aligned conformal spacer layer as shown in FIG. 12, a second layer 1602, such as a thin self-aligned oxide spacer 1602 is applied over the hard mask layer 106 and first layer 1102. The first and second layer may be chosen from different materials in addition to the illustrated layer pair of a first layer of silicon nitride with a second layer of silicon oxide applied over the first layer. Other combinations include (first material is listed first/second material is listed second): Silicon Oxide/Silicon Nitride; Silicon BoroCarbon Nitrides (SiBCN)/Silicon Nitride; Silicon OxyCarbon Nitrides (SiOCN)/Silicon Nitride; SiOCN/SiBCN; and SiBCN/Silicon Oxide.

In the alternate embodiments illustrated in FIG. 15 to FIG. 19 two different semiconductor materials are simultaneously subjected to an etching process in order to simultaneously form fins in the PFET and the NFET areas. Different semiconductor materials are removed by RIE at differing rates, so that in order to produce fins having features of a given final critical dimension those in the semiconductor material which is more readily etched need to be masked off in a broader initial dimension than are areas of semiconductor material that is less readily etched. The coating layer pairs, such as those outlined above, are selected such that the second coating layer can be differentially etched away while leaving a protective layer of the first layer material on the substrate.

Figure 17:
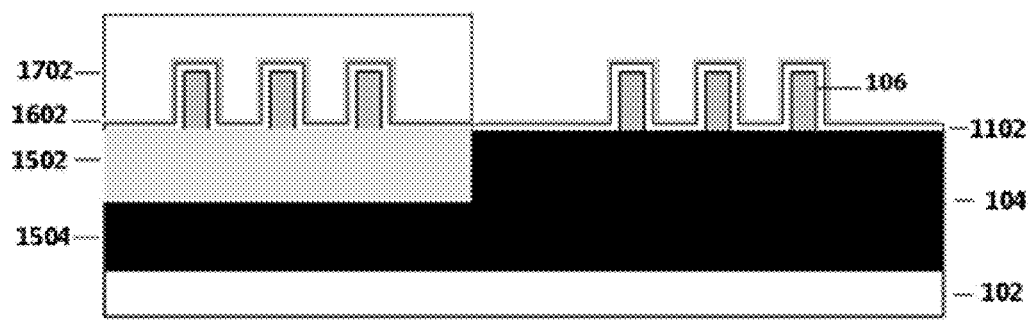
FIG. 17 is a side view showing blocking resist on the PFET area.
Figure 18:
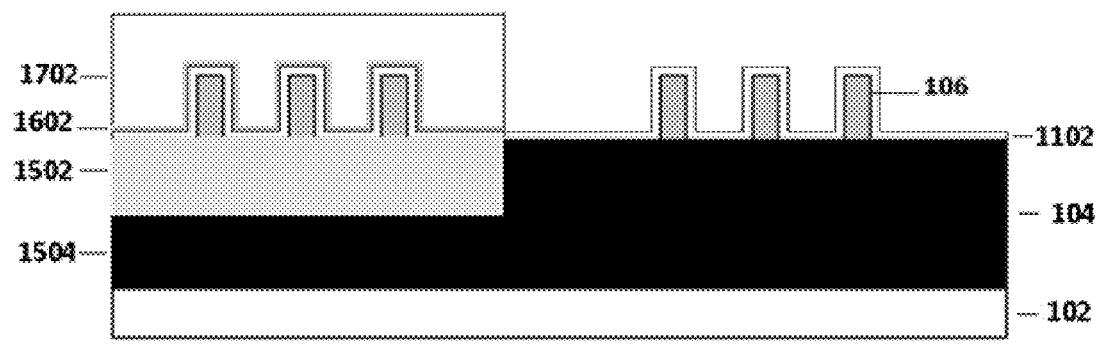
FIG. 18 is a side view after removal of the thin self-aligned oxide.

FIG. 17 illustrates a blocking resist 1702 applied to the PFET area 1502, as preparation for subsequent removal of the oxide spacer 1602 from the unblocked NFET area 1504 (as shown in FIG. 18).

FIG. 18 illustrates the structures after removing the self-aligned conformal spacer layer 1602 on the NFET area, leaving the oxide spacer 1602 conforming only to the PFET area 1502, under the blocking resist 1702.

Figure 19:
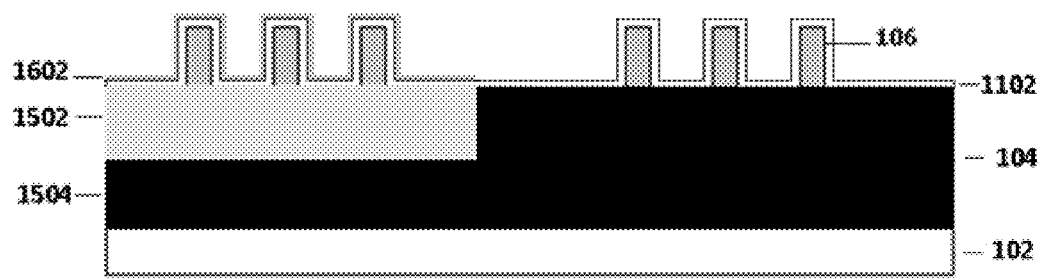
FIG. 19 is a side view of the structure after removal of the blocking resist.

FIG. 19 illustrates the structures after removing the blocking resist 1702, the structures are coated with self-aligned conformal spacer layer 1102 on the NFET area, and the oxide spacer 1602 conforming to the self-aligned conformal spacer layer 1102 over the PFET area 1502.

Figure 20:
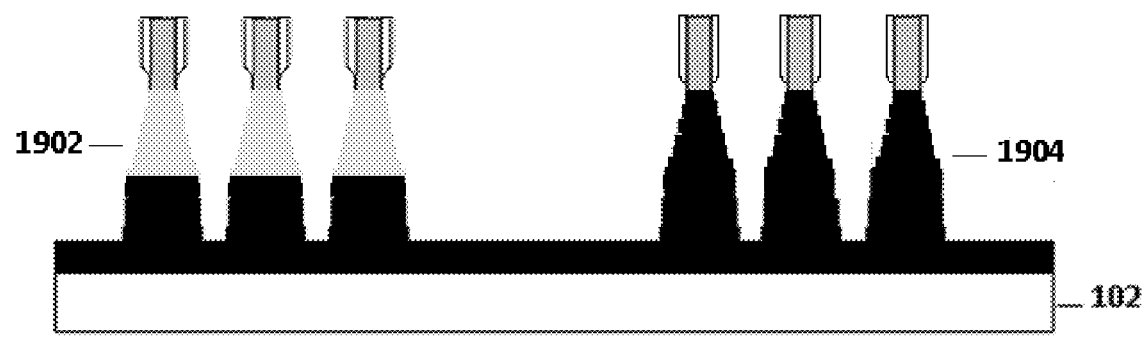
FIG. 20 is a side view of the PFET fins and NFET fins.

FIG. 20 illustrates the PFET fins 1902 and NFET fins 1904.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A multi-channel finFET comprising:
    a hard mask layer;
    a semiconductor layer having areas of a first semiconductor material and a second semiconductor material in contact with the hard mask layer, wherein the semiconductor layer having its longest dimension in an x-y direction;
    a plurality of fins of desired dimension in the first semiconductor material and the second semiconductor material, wherein the plurality of fins have their longest dimension in a z-direction, wherein the z-direction is normal to the x-y plane;
    a first conformal coating layer on the plurality of fins;

a second conformal coating layer on the first conformal coating layer;
a third conformal coating layer on the second conformal coating layer,
wherein the first conformal coating layer comprises a thickness of 5 to 20 nanometers,
wherein the second conformal coating layer comprises a thickness of 1 to 5 nanometers,
wherein the first conformal coating layer and the second conformal coating layer are different materials selected from silicon oxide, silicon nitride, SiBCN (silicon borocarbon nitride), and SiOCN (silicon oxycarbon nitride).

* * * * *